(12) United States Patent
Vazach et al.

(10) Patent No.: US 10,158,358 B2
(45) Date of Patent: Dec. 18, 2018

(54) LOW-POWER DISSIPATION INPUT CIRCUIT

(71) Applicant: Rockwell Automation Technologies, Inc., Mayfield, OH (US)

(72) Inventors: Joseph Vazach, Mentor, OH (US); Terry Deloria, Ashtabula, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 268 days.

(21) Appl. No.: 15/006,512

(22) Filed: Jan. 26, 2016

(65) Prior Publication Data
US 2016/0294385 A1 Oct. 6, 2016

Related U.S. Application Data

(60) Provisional application No. 62/143,286, filed on Apr. 6, 2015.

(51) Int. Cl.
| G02B 27/00 | (2006.01) |
| H03K 17/78 | (2006.01) |
| H04B 10/80 | (2013.01) |
| G05F 1/56 | (2006.01) |

(52) U.S. Cl.
CPC ............ *H03K 17/78* (2013.01); *G05F 1/56* (2013.01); *H04B 10/801* (2013.01); *H04B 10/802* (2013.01)

(58) Field of Classification Search
CPC ........ H03K 17/78; G05F 1/56; H04B 10/801; H04B 10/802
USPC ....................................................... 250/551
See application file for complete search history.

(56) References Cited

U.S. PATENT DOCUMENTS

| 4,086,503 | A | | 4/1978 | Fox et al. | |
| 5,111,070 | A | | 5/1992 | Murphy et al. | |
| 5,398,025 | A | * | 3/1995 | Herman | G01R 19/155 323/282 |
| 5,534,768 | A | * | 7/1996 | Chavannes | G05F 1/577 307/75 |
| 6,043,703 | A | | 3/2000 | Bavol | |
| 2005/0098743 | A1 | * | 5/2005 | Tanabe | H03K 17/941 250/551 |

(Continued)

FOREIGN PATENT DOCUMENTS

| EP | 0139210 A2 | 5/1985 |
| EP | 0393282 A2 | 10/1990 |

(Continued)

OTHER PUBLICATIONS

Extended European Search Report dated Aug. 18, 2016: European Patent Application No. 16161030.5—(7) pages.

*Primary Examiner* — Georgia Y Epps
*Assistant Examiner* — Kevin Wyatt
(74) *Attorney, Agent, or Firm* — Boyle Fredrickson, SC

(57) ABSTRACT

An input circuit for an I/O module for an industrial controller or the like provides a shunt regulator for precisely controlling the maximum current through the LED of an optical isolator. Substantial improvement in the current regulation decreases power dissipation in the optical isolator element. A low voltage shunt circuit prevents leakage from the shunt regulator from activating the optical isolator at low voltages allowing more sensitive optical isolators providing additional power dissipation savings.

19 Claims, 4 Drawing Sheets

(56) References Cited

U.S. PATENT DOCUMENTS

| | | | | |
|---|---|---|---|---|
| 2005/0139791 A1* | 6/2005 | Breinlinger | ........ | H03K 17/7955 |
| | | | | 250/551 |
| 2012/0175504 A1* | 7/2012 | Holland | ............... | H04B 10/802 |
| | | | | 250/214 A |
| 2013/0307514 A1* | 11/2013 | O'Connell | ........... | H03K 17/785 |
| | | | | 323/312 |
| 2013/0320883 A1* | 12/2013 | Zheng | ................ | H05B 33/0815 |
| | | | | 315/307 |
| 2014/0197337 A1* | 7/2014 | Vazach | ............ | H03K 19/01806 |
| | | | | 250/551 |

FOREIGN PATENT DOCUMENTS

| | | | |
|---|---|---|---|
| EP | 1981167 A1 | 10/2008 | |
| EP | 2757690 A2 | 7/2014 | |

\* cited by examiner

LOW-POWER DISSIPATION INPUT CIRCUIT

CROSS REFERENCE TO RELATED APPLICATION

This application claims the benefit of U.S. provisional application 62/143,286 filed Apr. 6, 2015 and hereby incorporated by reference.

STATEMENT REGARDING FEDERALLY SPONSORED RESEARCH OR DEVELOPMENT

--

BACKGROUND OF THE INVENTION

The present invention relates to industrial control systems and in particular to an I/O module for industrial control systems, the I/O module providing reduced power dissipation and a more compact form factor.

Industrial control systems were originally developed to provide control logic for equipment in factories operating to manufacture products on an assembly line or in batch processes. Early industrial control systems replaced racks of relays with specialized circuitry that mimicked these relays but used a programming language.

Current industrial control systems continued this evolution using modern electronic computer processors and circuits but may be distinguished from standard computers by architectures that address the needs for high reliability, safety, and resistance to environmental damage and normal contamination. This latter concern generally means that industrial control system components are designed without cooling fans or ports that communicate with the outside air, placing a premium on low heat dissipation.

Industrial control systems must function in a highly varied set of manufacturing applications. For this reason, industrial control systems normally employ a modular construction form in which one or more modular controllers are teamed with local or remote I/O modules and other control devices that provide the actual interface between the controller and the hardware of sensors and actuators driving the industrial process.

One type of input I/O module operates as an interface to receive an input signal from a sensor or the like, the sensor providing an output voltage in a first voltage range indicating a low state and an output voltage in a second voltage range indicating a high state. Generally, a low state may be represented by an input voltage between 0 and 10 volts and a high state may be represented by an input voltage between 10 to 32 volts.

It is important to prevent high electrical voltages originating in the controlled equipment or process from damaging the industrial control system. For this reason, I/O modules normally include an isolator. One possible isolator is an optical isolator (optoisolator/optocoupler) which provides an electrically actuated light source (an LED) insulated and electrically isolated from a photodetector (for example, a photodiode), the latter of which communicates with the remainder of the industrial control system. The optical isolator provides for good common mode rejection (that is, canceling noise that is present on both the ground and input side of the I/O module) and protects the industrial control system from extremely large voltage inputs which may accidentally be applied to the inputs of the I/O module.

Different devices attached to an I/O module may have different output voltage ranges with high state voltages ranging from as low as 5 volts to 30 volts or more. One way of accommodating this voltage range without exceeding the current capacity of the optical isolator is to use a series-limiting resistor. Such an approach may require different limiting resistors for different input voltage ranges and thus the fabrication of multiple I/O modules for different applications.

An alternative approach is disclosed in U.S. Pat. No. 6,043,703 to Bavol, assigned to the assignee of the present invention and hereby incorporated by reference. In this patent, a transistor-based, series current limiter is placed between one input of the I/O module and the light source of the optocoupler to limit the current to the optocoupler over the wide input voltage range. This active regulation of series current allows a single I/O module to work over a wide input voltage range.

It is important that the optical isolator not be activated by leakage current from the series current limiter. In order to ensure this result, it is normal to use optical isolators that are specially selected or specified to have relatively larger currents for activation.

SUMMARY OF THE INVENTION

The present inventors have recognized that a significant reduction in dissipated heat can be obtained by providing "flatter" current regulation possible by using a high gain comparator-type regulator system. By decreasing the rise in current with rise of input voltage, a square relationship in increase in power dissipation with voltage (voltage drop times current) can be reduced to a proportional increase in power dissipation, substantially decreasing typical power dissipation.

The inventors have also recognized that the need to specify or select optical isolators having high current activations detrimentally increases the power dissipated in the product such as may tend to counteract the reduced power dissipation provided by improved current regulation. Accordingly the invention also provides for an optical isolator bypass circuit that shunts leakage current, otherwise passing through the series current regulator, around the optical isolator allowing the use of lower power dissipation optical isolators and providing greater flexibility in the selection of optical isolators.

Accordingly, in one embodiment the invention provides input circuit for an industrial controller having input terminals for receiving a sensed voltage and providing a current path between the input terminals and also having an isolator having isolator inputs connected in series along the current path between the input terminals so that current flow between the input terminals in a first direction activates the isolator. An active current limiter is placed in series along the current path with the isolator inputs to limit current flow through the isolator inputs; and the active current limiter provides a comparator comparing a voltage drop of a sensing resistor in series with the isolator inputs to a fixed voltage reference to control a transistor which controls series current through the isolator inputs.

It is thus a feature of at least one embodiment of the invention to provide highly stable current limiting in an I/O circuit to substantially reduce power dissipation.

The active current limiter may be a current limiting transistor in series with the isolator inputs controlled by the output of the comparator.

It is thus a feature of at least one embodiment of the invention to provide a current control element that can readily accommodate the necessary power dissipation and voltage range to be directly interposed in the path of the isolator.

The active current limiter may be a voltage regulator providing the comparator with a first input connected on one side of the sensing resistor and a second input connected to a second side of the sensing resistor through a precision voltage reference having a predetermined voltage drop, and wherein the output from the comparator connects to a control input of the current limiting transistor to sink current from that control input when the voltage drop across the sensing resistor exceeds a predetermined level.

It is thus a feature of at least one embodiment of the invention to make use of a standard electrical shunt regulator to provide highly stable and precise current regulation reducing power dissipation.

The comparator may include a differential amplifier circuit including a differential pair of transistors.

It is thus a feature of at least one embodiment of the invention to provide a simple high gain circuit for current regulation.

The isolator may be an optical isolator and the isolator inputs may be connected across a light-emitting diode of the optical isolator and the optical isolator may have outputs connected across a photosensor receiving light from the light-emitting diode to activate the photosensor for conduction at a given light level.

It is thus a feature of at least one embodiment of the invention to provide a circuit well suited for optical isolation in which current control directly affects power dissipation in the light-emitting diode.

The input circuit may further include a Zener diode in series with the inputs of the isolator to block current through the isolator at voltages of less than a predetermined Zener voltage amount applied across the input terminals.

It is thus a feature of at least one embodiment of the invention to reduce false triggering of the input circuit at low voltages when active shunting is not employed.

In one embodiment, the input circuit may include a bypass circuit responsive to the voltage across the terminals to provide a bypass conduction path across the input of the isolator at voltages below a predetermined voltage.

It is thus a feature of at least one embodiment of the invention to provide greater flexibility in the selection of optical isolators, for example, allowing optical isolators with lower activation currents or broader variation in activation currents to be employed by shunting the optical isolators to prevent them from triggering at low currents. It is another feature of at least one embodiment of the invention to permit the use of optical isolators with lower activation currents to allow a lower level of series current regulation and thus lower power dissipation in the optical isolator.

The bypass circuit may bypass current from the active current limiter that would otherwise pass through the isolator input terminals at voltages below the predetermined voltage.

It is thus a feature of at least one embodiment of the invention to accommodate the leakage current associated with more sophisticated current control circuitry such as a comparator.

The predetermined voltage may be below a voltage providing a current flow through the isolator inputs sufficient to activate the isolator, or the predetermined voltage may be above the voltage providing a current flow from the active current limiter that would be sufficient to activate the isolator.

It is thus a feature of at least one embodiment of the invention to accommodate a broader range of specifications for the optical isolator and to effectively bring their switching voltages into closer conformity by compressing the voltage range that produces a wider range of activation currents.

The bypass circuit may provide a shunt transistor connected across the isolation inputs to provide a conduction path shunting the isolation inputs when a threshold voltage is applied to a control input of the transistor, and the control input receives voltage from an input terminal to turn the shunt transistor on for shunting when a voltage on the input terminal exceeds the threshold voltage.

It is thus a feature of at least one embodiment of the invention to provide an extremely simple modification to the optical isolator to provide a bypass capability immediately upon application of low voltages to the input terminals. By providing voltage directly from an input terminal to a bypass transistor, the bypass transistor is turned on immediately at low voltages.

The bypass circuit may further include a threshold circuit connecting the control input of the shunt transistor to ground when the voltage on the input terminal exceeds a second threshold voltage.

It is thus a feature of at least one embodiment of the invention to deactivate the bypass circuit at an arbitrary increased voltage on the input terminals.

The input circuit may include a Zener diode in series with the inputs of the isolator to block current through the isolator at voltages of less than a predetermined Zener voltage amount applied across the input terminals, and the control input may be received from an input terminal before the Zener diode and the threshold circuit receives an input from the input terminal after the Zener diode.

It is thus a feature of at least one embodiment of the invention to make use of a Zener diode having other functionality in the input circuit to create a rapidly switch threshold turning off the bypass transistor.

The threshold circuit may be a second shunting transistor connected to shunt the control input of the shunting transistor to ground according to a control input of the second shunting transistor connected to a voltage divider receiving voltage after the Zener diode.

It is thus a feature of at least one embodiment of the invention to provide a circuit that can flexibly change the operating range of the bypass circuit through adjustment of a voltage divider.

These particular objects and advantages may apply to only some embodiments falling within the claims and thus do not define the scope of the invention.

DETAILED DESCRIPTION OF THE PREFERRED EMBODIMENT

Figure 1:
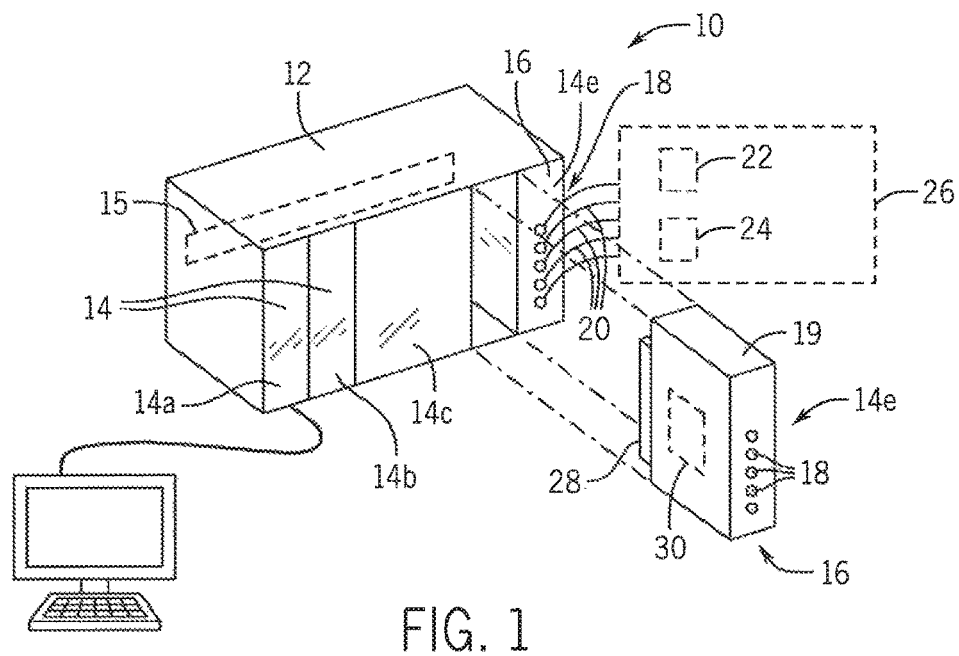
FIG. 1 is a simplified representation of an industrial control system having a modular construction with an I/O module per the present invention that may be installed in a housing or the like, the I/O module providing exposed terminals for communicating with an industrial control process and a rear connector for communicating with a common industrial control backplane.

Referring now to FIG. 1, an industrial control system 10 may provide for a housing 12 or similar support that assembles together multiple modules 14 to communicate together on a common industrial control backplane 15 when so assembled. Modules 14 may generally include an industrial controller 14a executing a control program, a communication module 14b, for example, communicating on an industrial control network (such as those using Common Industrial Protocols (CIP)) such as EtherNet/IP, DeviceNet, and ControlNet), a power supply 14c, and one or more I/O modules 14e to be discussed herein.

One I/O module 14 may be an input module 16 having a set of electrical terminals 18 on a front face of a housing 19, the terminals 18 adapted to be connected to conductors 20 that may communicate with various sensors 22 and 24 of an industrial process 26. A rear face of the housing 19 may provide an electrical connector 28 that may communicate with a corresponding connector on the backplane 15.

It will be appreciated that backplane 15 may be alternatively contained partially within each module 14 and formed by interconnections via connector pairs (not shown) on each of the modules 14 connecting with adjacent modules when the modules 14 are assembled together.

Figure 2:
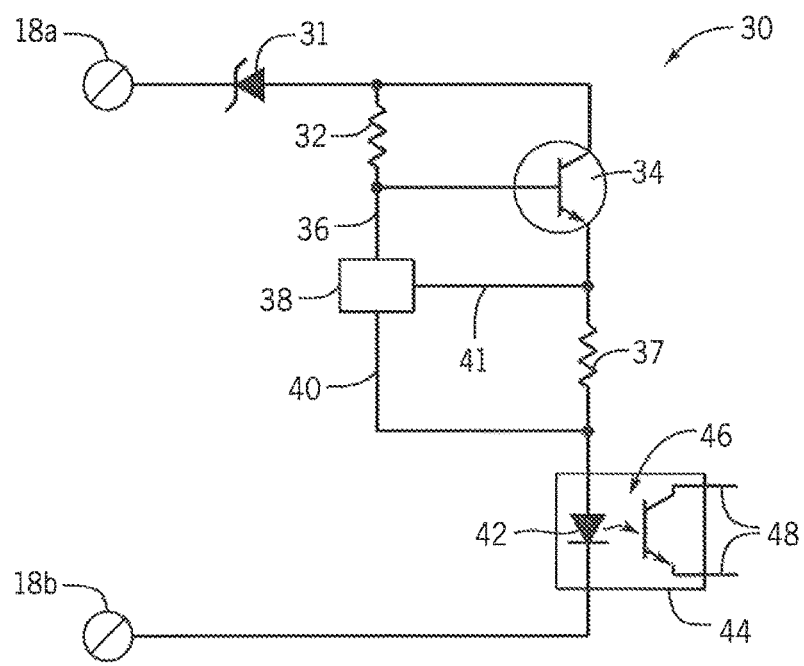
FIG. 2 is a functional block diagram of the circuit of the I/O module of FIG. 1.

Referring now also to FIG. 2, the input module 16 may include an input circuit 30 communicating with terminals 18a and 18b to detect a positive polarity voltage on terminal 18a with respect to terminal 18b from 5 to 30 volts.

Current received from terminal 18a passes through a Zener diode 31 which blocks current until at least five volts is applied. The current then passes in parallel to the first terminal of a resistor 32 and the collector of an NPN transistor 34. The base of the NPN transistor 34 connects to the second terminal of the resistor 32 and also to a "cathode" 36 of a low voltage precision shunt regulator 38. The emitter of the NPN transistor 34 connects to a reference input 41 of the shunt regulator 38 and also to the first terminal of a resistor 37. The second terminal of resistor 37 communicates with an "anode" 40 of the shunt regulator 38. The junction between the anode 40 and the second terminal or resistor 37 connects to the anode of a light-emitting diode (LED) 42 forming part of an optocoupler 44. Light from the diode 42 may strike a photo transistor 46 within the optocoupler 44 to provide a switch current signal across terminals 48 that may be communicated with other circuitry used to detect the presence of a positive voltage at terminal 18a. The cathode of the LED 42 connects with terminal 18b.

Figure 3:
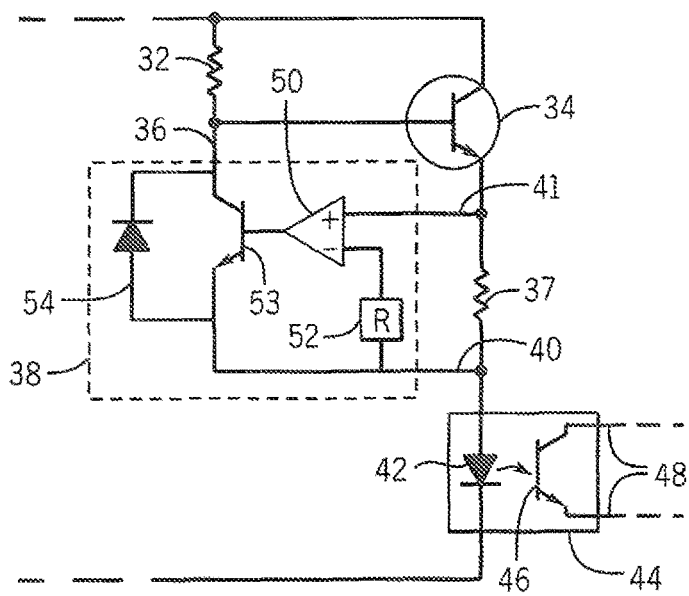
FIG. 3 is a more detailed schematic diagram of the circuit of FIG. 2.

Referring now to FIG. 3, the shunt regulator 38 may include internal comparator circuit 50 whose positive or non-inverting input is connected to the reference input 41. The inverting or negative input of the comparator circuit 50 connects through a precision voltage reference 52 to the anode of the shunt regulator 38. Precision voltage reference 52, for example, may provide a fixed voltage drop of 1.24 volts at operating currents of 80 microamps to about 20 milliamps. The output of the comparator circuit 50 provides current to the base of an NPN transistor 53 whose collector provides the cathode 36 of the shunt regulator 38 and whose emitter is connected to the anode 40 of the shunt regulator 38. A diode 54 is connected with its cathode joined with the collector of transistor 53 and its anode attached to the emitter of transistor 53 to be reverse biased (non-conducting) during normal operation.

Figure 4:
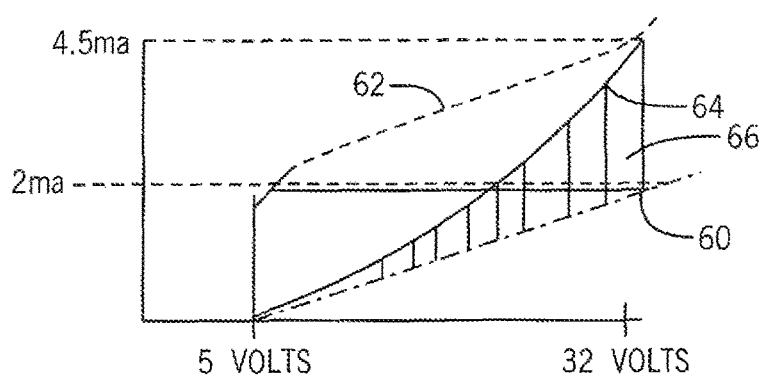
FIG. 4 is a plot of power dissipation for the present invention in contrast to the prior art.

Referring now to FIGS. 3 and 4, when the voltage between terminals 18a and 18b increases to about five volts, the Zener diode 31 (shown in FIG. 2) begins conducting. At the point of this first conduction, the current flowing through resistor 37 is very small and presents a voltage drop less than the voltage of the voltage reference 52 across resistor 37 causing the output of the comparator circuit 50 to be low, turning off transistor 53. As a result current flows through resistor 32 directly to the base of transistor 34 biasing the transistor 34 on. Resistor 32 is chosen so that transistor 34 rapidly begins to increase its conduction with incremental increases in the voltage at terminal 18a until about two milliamps of current is flowing from its emitter resistor 37 and through LED 42. This current is sufficient to activate photo transistor 46. The two milliamps current is also sufficient to cause a voltage drop across resistor 37 to substantially equal the voltage reference 52.

Increases in current through resistor 37 beyond this point of two milliamps causes comparator circuit 50 to turn on, activating transistor 53 and shunting current away from the base of transistor 34. A negative feedback is thereby effected regulating the current through resistor 37 at very close to a constant two milliamps limited only by the gain of the feedback loop. The shunt regulator 38 provides a small signal gain in excess of 20 decibels (measured from reference input 41) and an output impedance of less than 10 ohms (measured at cathode 36) for frequencies of up to 500 kilohertz. The shunt regulator 38 may operate at voltages as low as 1.2 volts and provides a voltage across the input terminals of comparator circuit 50 from 0 to 6 volts with a voltage tolerance of less than two percent.

Referring to FIG. 4, when the current through the transistor 34 is held at two milliamps (plus or minus 0.5 milliamps) over a range of 5 to 32 volts, the dissipated power 60 rises linearly with voltage. In contrast, prior art systems that allow a slow increase in current 62 with increases in voltage from 5 to 32 volts (for example, provided by lower quality regulation) from two milliamps to 4.5 milliamps cause an increase in power dissipation 64 that rises exponentially producing an additional heat dissipation 66 beyond that provided by the present invention.

Figure 5:
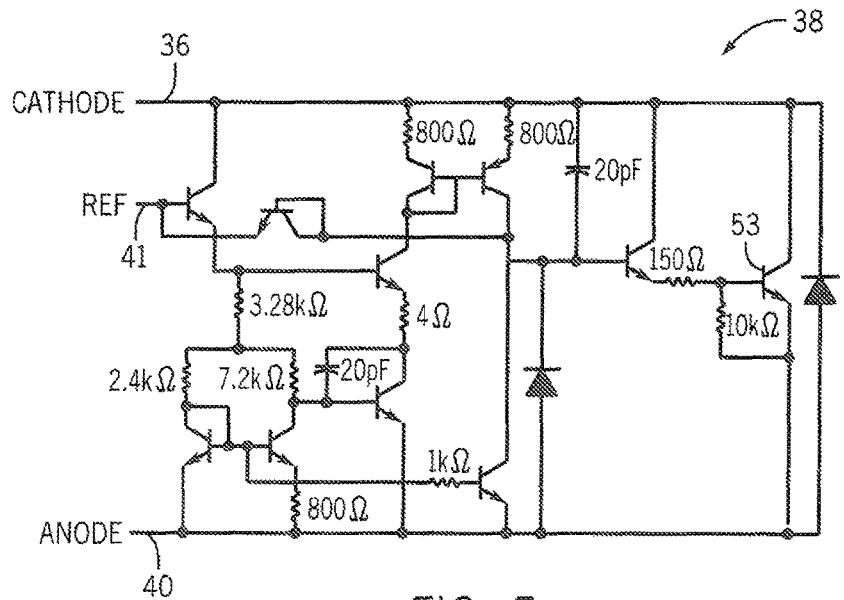
FIG. 5 is a detailed diagram of the precision shunt regulator used in FIG. 3.

The shunt regulator 38 may, for example, be a TLV431 Low-Voltage Adjustable Precision Shunt Regulator commercially available from Texas Instruments of Dallas, Tex. A simplified diagram of one embodiment of this shunt regulator 38 is shown in FIG. 5 which provides for a temperature drift in the voltage reference 52 of less 11 millivolts over a range of 0 degrees centigrade to 70 degrees centigrade, a low operational current of 80 microamps, a 0.25 ohm output impedance at up to 15 kilohertz and an operating voltage of up to six volts.

Figure 6:
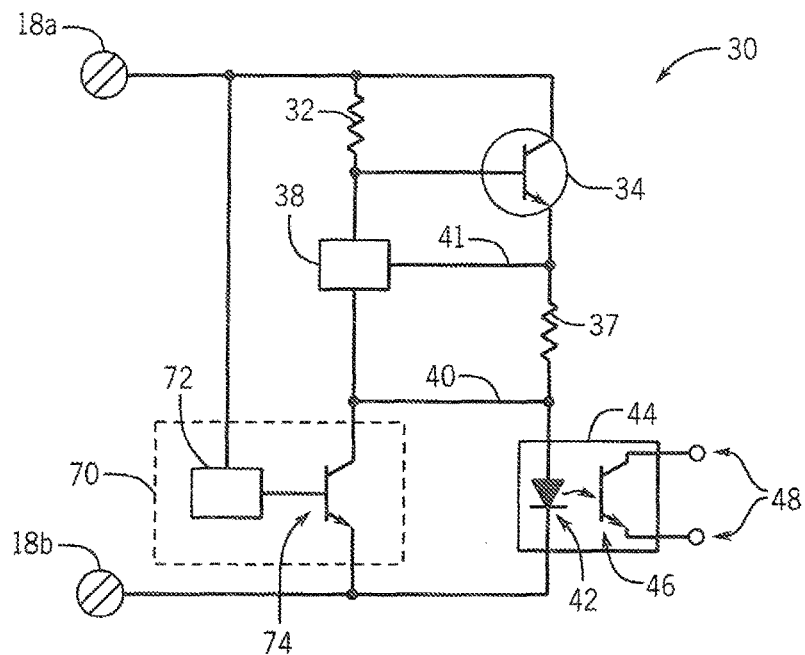
FIG. 6 is a figure similar to that of FIG. 2 showing an embodiment of the invention providing for an optical isolator bypass circuit.

Referring now to FIG. 6, in a further embodiment, the input circuit 30 may include a low-voltage bypass circuit 70 providing a voltage threshold detector 72 communicating with a bypass transistor 74. The bypass transistor 74 may, for example, be an NPN transistor having its collector attached to the anode of LED 42 and its emitter connected to ground terminal 18b and its base connected to the threshold voltage threshold detector 72. When bypass transistor 74 is turned on by a raised voltage from the voltage threshold detector 72, any leakage current through transistor 34 and shunt regulator 38 will be bypassed around LED 42 preventing it from activating the optocoupler 44.

Figure 7:
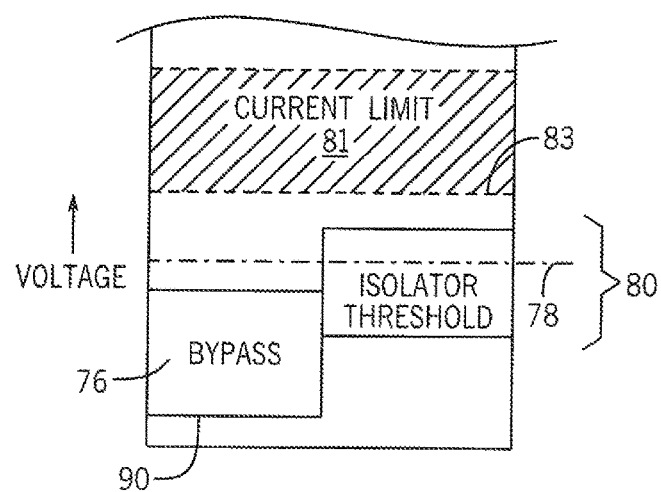
FIG. 7 is a chart showing the different operating modes of the circuit of FIG. 6 as a function of input voltage.

Referring also to FIG. 7, bypass transistor 74 will be activated during a bypass mode 76 generally below an optocoupler threshold voltage 78 (measured at terminals 18) falling within the threshold detection range 80 with respect to the voltage applied across terminals 18a and 18b. The optocoupler threshold voltage 78 is a voltage that produces the necessary current to activate the optocoupler 44 from an off to an on state and will generally vary slightly based on the component used and also based on the leakage current from the shunt regulator 38 but will fall within the threshold detection range 80 permissible by the circuit and used to select the optocoupler 44.

The bypass mode 76 begins at a low-voltage 90 well below the lowest possible optocoupler threshold voltage 78 and typically being the forward bias voltage of transistor 74. The bypass mode 76 may remain up to a voltage level typically slightly within the threshold detection range 80 at which switching of the optocoupler 44 is permitted to ensure that the optocoupler 44 does not switch before this level.

As the voltage rises above the bypass mode 76, the shunt transistor 74 turns off and circuit 30 enters into a detecting mode within threshold detection range 80 in which current through the resistor 37 and leakage current from the regulator 38 will pass through the diode 42 causing the optical photo transistor 46 to be turned on at the optocoupler threshold voltage 78 such as will vary slightly depending on the particular characteristics of the optocoupler 44 and the regulator 38.

As the voltage continues to rise, the circuit 30 will enter into a regulation range 81 where shunt regulator 38 is activated controlling transistor 34 to limit the current to the diode 42 to a limit level 83 (about two milliamps) as has been discussed above.

Figure 8:
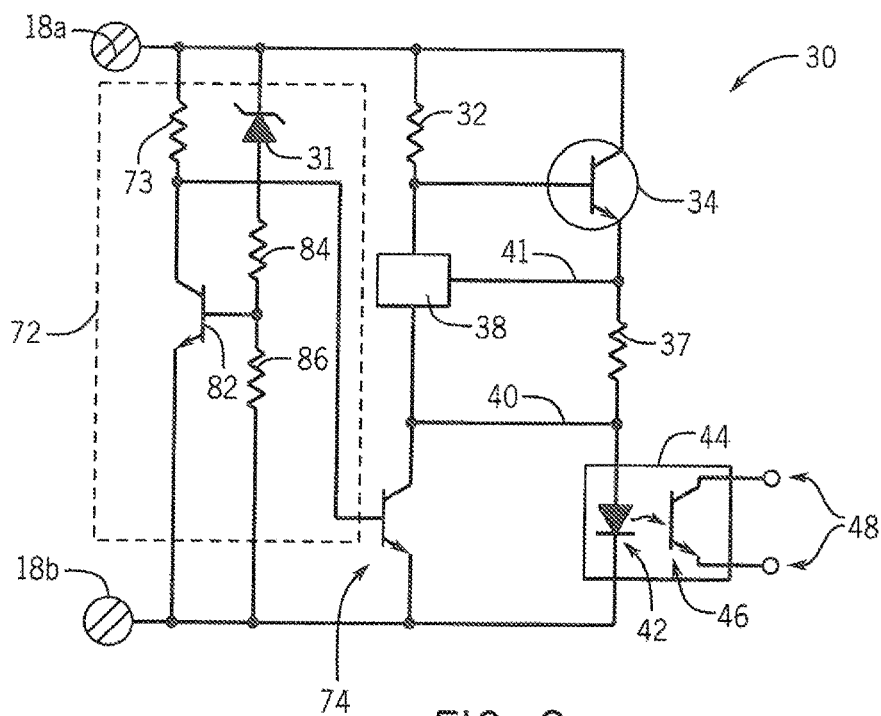
FIG. 8 is a figure similar to that of FIG. 6 providing additional component level detail on the bypass circuit.

Referring now to FIG. 8, the voltage threshold detector 72 controlling the bypass transistor 74 may provide a voltage sensing transistor 82, for example, being an NPN transistor having its collector attached through resistor 73 to terminal 18a, its emitter connected to terminal 8b and its base connected to a junction between resistors 84 and 86 forming a resistive divider. This resistive divider at one end connects to terminal 18b and at the other end connects through a Zener diode 31 to terminal 18a. Accordingly, sensing transistor 82 will turn on at a voltage above the Zener breakdown voltage defining the top of the bypass region 76 of FIG. 7.

The junction between the emitter of transistor 82 and resistor 73 provides the output to the base of bypass transistor 74. Unlike in the previous embodiment, the collector of transistor 34 may attach directly to terminal 18a eliminating the need for the Zener diode 31 to handle high currents and providing improved stability to the switching points of the circuit.

When the voltage on terminals 18a and 18b is in the bypass mode 76, below the Zener breakdown voltage, Zener diode 31 will be nonconducting meaning that the base of transistor 82 is substantially at ground, turning transistor 82 off such as raises the voltage of its collector, turning bypass transistor 74 on.

As the voltage passes above a Zener breakdown voltage within the bypass mode 76, the Zener diode 31 will begin to conduct, applying voltage to the voltage divider of resistors 84 and 86 raising the voltage on the base of transistor 82. At a predetermined voltage marking the end of the bypass mode 76, the base of transistor 82 rises in voltage sufficiently to turn transistor 82 on, pulling its collector downward to deactivate transistor 74 as the circuit enters the threshold detection range 80 above the bypass range 76. Transistor 82 continues to conduct as a voltage rises into the regulation range 81 continuing to hold bypass transistor 74 off.

As the voltage drops the sequence is reversed again turning on transistor 74 in the bypass mode 76.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications are hereby incorporated herein by reference in their entireties.

What we claim is:

1. An input circuit for an industrial controller comprising:
   input terminals for receiving a sensed voltage and providing a current path between the input terminals;
   an isolator having isolator inputs connected in series along the current path between the input terminals so that current flow between the input terminals in a first direction activates the isolator;
   an active current limiter placed in series along the current path with the isolator inputs to limit current flow through the isolator inputs; and
   a Zener diode in series with the inputs of the isolator to block current through the isolator at voltages of less than predetermined Zener voltage amount applied across the input terminals;
   wherein the active current limiter provides a comparator comparing a voltage drop of a sensing resistor in series with the isolator inputs to a fixed voltage reference to control a transistor which controls series current through the isolator inputs.

2. The input circuit of claim 1 wherein the active current limiter includes a current limiting transistor in series with the isolator inputs controlled by an output of the comparator.

3. The input circuit of claim 2 wherein the active current limiter is a voltage regulator providing the comparator with a first input connected on one side of the sensing resistor and a second input connected to a second side of the sensing resistor through a precision voltage reference having a predetermined voltage drop and wherein the output from the comparator connects to a control input of the current limiting transistor to sink current from that control input when the voltage drop across the sensing resistor exceeds a predetermined level.

4. The input circuit of claim 3 wherein the comparator includes a differential amplifier circuit including a differential pair of transistors.

5. The input circuit of claim 4 wherein the isolator is an optical isolator and wherein the isolator inputs are connected across a light-emitting diode of the optical isolator and the optical isolator has outputs connected across a photosensor receiving light from the light-emitting diode to activate the photosensor for conduction at a given light level.

6. The input circuit of claim 1 further including a bypass circuit responsive to the voltage across the terminals to provide a bypass conduction path across the input of the isolator at voltages below a predetermined voltage.

7. The input circuit of claim 6 wherein the bypass circuit bypasses current from the active current limiter that would otherwise pass through the isolator input terminals at voltages below the predetermined voltage.

8. The input circuit of claim 7 wherein the predetermined voltage is above a voltage providing a current flow through the isolator inputs sufficient to activate the isolator.

9. The input circuit of claim 7 wherein the predetermined voltage is above a voltage providing a current flow from the active current limiter that would be sufficient to activate the isolator.

10. The input circuit of claim 7 wherein the bypass circuit provides a shunt transistor connected across the isolator inputs to provide a conduction path shunting the isolation inputs when a threshold voltage is applied to a control input of the transistor and wherein the control input receives voltage from an input terminal to turn the shunt transistor on for shunting when a voltage on the input terminal exceeds the threshold voltage.

11. The input circuit of claim 10 wherein the bypass circuit further includes a threshold circuit connecting the control input of the shunt transistor to ground when the voltage on the input terminal exceeds a second threshold voltage.

12. The input circuit of claim 11 wherein the threshold circuit is a second shunting transistor connected to shunt the control input of the shunting transistor to ground according to a control input of the second shunting transistor connected to a voltage divider receiving voltage after the Zener diode.

13. An input circuit for an industrial controller comprising:
input terminals for receiving a sensed voltage and providing a current path between the input terminals;
an isolator having isolator inputs connected in series along the current path between the input terminals so that current flow between the input terminals in a first direction activates the isolator;
an active current limiter placed in series along the current path with the isolator inputs to limit current flow through the isolator inputs;
a bypass circuit response to the voltage across the terminals to provide a bypass conduction path across the input of the isolator at voltages below a predetermined voltage, wherein:
the bypass circuit bypasses current from the active current limiter that would otherwise pass through the isolator input terminals at voltages below the predetermined voltage,
the bypass circuit provides a shunt transistor connected across the isolator inputs to provide a conduction path shunting the isolation inputs when a threshold voltage is applies to a control input of the transistor,
the control input receives voltage from an input terminal exceeds the transistor on for shunting when a voltage on the input terminal exceeds the threshold voltage, and
the bypass circuit further includes a threshold circuit connecting the control input of the shunt transistor to ground when the voltage on the input terminal exceeds a second threshold voltage; and
a Zener diode in series with the inputs of the isolator to block current through the isolator at voltages of less than a predetermined Zener voltage amount applied across the input terminals, wherein
the active current limiter provides a comparator comparing a voltage drop of a sensing resistor in series with the isolator inputs to a fixed voltage reference to control a transistor which controls series current through the isolator inputs, and
the control input is received from an input terminal before the Zener diode and the threshold circuit receives an input from the input terminal after the Zener diode.

14. The input circuit of claim 13 wherein the threshold circuit is a second shunting transistor connected to shunt the control input of the shunting transistor to ground according to a control input of the second shunting transistor connected to a voltage divider receiving voltage after the Zener diode.

15. An input circuit for an industrial controller comprising:
input terminals for receiving a sensed voltage and providing a current path between the input terminals;
an isolator having isolator inputs connected in series along the current path between the input terminals so that current flow between the input terminals in a first direction activates the isolator;
an active current limiter placed in series along the current path with the isolator inputs to limit current flow through the isolator inputs;
a bypass circuit responsive to the voltage across the terminals to provide a bypass conduction path across the input of the isolator at voltages below a predetermined voltage; and
a Zener diode in series in the bypass circuit to block current through the isolator at voltages of less than a predetermined Zener voltage amount applied across the input terminals,
wherein the active current limiter provides a comparator comparing a voltage drop of a sensing resistor in series with the isolator inputs to a fixed voltage reference to control a transistor which controls series current through the isolator inputs.

16. The input circuit of claim 15 wherein the active current limiter includes a current limiting transistor in series with the isolator inputs controlled by an output of the comparator.

17. The input circuit of claim 16 wherein the active current limiter is a voltage regulator providing the comparator with a first input connected on one side of the sensing resistor and a second input connected to a second side of the sensing resistor through a precision voltage reference having a predetermined voltage drop and wherein the output from the comparator connects to a control input of the current limiting transistor to sink current from that control input when the voltage drop across the sensing resistor exceeds a predetermined level.

18. The input circuit of claim 17 wherein the comparator includes a differential amplifier circuit including a differential pair of transistors.

19. The input circuit of claim 18 wherein the isolator is an optical isolator and wherein the isolator inputs are connected across a light-emitting diode of the optical isolator and the optical isolator has outputs connected across a photosensor receiving light from the light-emitting diode to activate the photosensor for conduction at a given light level.

* * * * *

UNITED STATES PATENT AND TRADEMARK OFFICE
CERTIFICATE OF CORRECTION

PATENT NO. : 10,158,358 B2
APPLICATION NO. : 15/006512
DATED : December 18, 2018
INVENTOR(S) : Vazach et al.

It is certified that error appears in the above-identified patent and that said Letters Patent is hereby corrected as shown below:

In the Claims

Claim 13, Column 10, Line 13-16:
REPLACE "the control input receives voltage from an input terminal exceeds the transistor on for shunting when a voltage on the input terminal exceeds the threshold voltage, and"
WITH "the control input receives voltage from an input terminal to turn the shunt transistor on for shunting when a voltage on the input terminal exceeds the threshold voltage, and"

Signed and Sealed this
Nineteenth Day of March, 2019

Andrei Iancu
*Director of the United States Patent and Trademark Office*